United States Patent
Sauer et al.

[11] Patent Number: 5,933,122
[45] Date of Patent: Aug. 3, 1999

[54] ANTENNA SWITCH FOR WIRELESS ANTENNA DIVERSITY TELECOMMUNICATIONS DEVICES WITH TWO ANTENNAS

[75] Inventors: Jürgen Sauer, Henneckenrode; Volker Detering, Emmerich; Jürgen Lepping, Essen, all of Germany

[73] Assignee: Siemens Aktiengesellschaft, Munich, Germany

[21] Appl. No.: 08/793,424
[22] PCT Filed: Aug. 28, 1995
[86] PCT No.: PCT/DE95/01143
   § 371 Date: Feb. 25, 1997
   § 102(e) Date: Feb. 25, 1997
[87] PCT Pub. No.: WO96/07248
   PCT Pub. Date: Mar. 7, 1996

[30] Foreign Application Priority Data

Aug. 31, 1994 [DE] Germany ............... 44 30 987

[51] Int. Cl.$^6$ .................................................. H01Q 3/24
[52] U.S. Cl. ............................................... 343/876; 455/78
[58] Field of Search ............................... 343/725, 853, 343/876, 895; 455/78, 277.1; 375/267, 299, 347

[56] References Cited

U.S. PATENT DOCUMENTS

| | | | |
|---|---|---|---|
| 4,123,759 | 10/1978 | Hines et al. | 343/876 |
| 4,287,603 | 9/1981 | Moser | 343/895 |
| 4,412,223 | 10/1983 | Kautz | 343/876 |
| 4,513,412 | 4/1985 | Cox | 370/29 |
| 5,491,723 | 2/1996 | Diepstraten | 375/296 |
| 5,764,192 | 6/1998 | Fowler et al. | 343/876 |
| 5,786,763 | 7/1998 | Canipe | 343/876 |

FOREIGN PATENT DOCUMENTS

| | | |
|---|---|---|
| 0124319 A1 | 11/1984 | European Pat. Off. . |
| 0 218 843 A3 | 4/1987 | European Pat. Off. . |
| 43 42 249 A1 | 6/1994 | Germany . |
| 2273423 | 6/1994 | United Kingdom . |
| WO 94/10812 | 5/1994 | WIPO . |

OTHER PUBLICATIONS

Informatik Spektrum, (Computing Publication), Springer Verlag Berlin, Jun. 1991, year 14, No. 3, pp. 137 to 152, A. Mann: "Der GSM–Standard—Grundlage für digitale europäische Mobilfunknetze".

DECT standard (Digital European Cordless Telecommunication); Nachrichtentechnik Elektronik (Telecommunication Electronics), 42 (1992). No. 1, Jan./Feb. 1992, pp. 23 to 29, U. Pilger: "Struktur des DECT–Standards".

*Primary Examiner*—Don Wong
*Assistant Examiner*—Tan Ho
*Attorney, Agent, or Firm*—Hill & Simpson

[57] ABSTRACT

In order to minimize switching losses occurring in antenna switches for wireless antenna diversity telecommunications devices with two antennas, for example base station of a DECT cordless telephone, in each case an electronic switching element (SE1 . . . SE4), constructed for example as a PIN diode or switching diode, is arranged in a first signal path (SW1) from a transmitter (TR) to a first transmission/reception antenna (A1), a second signal path (SW2) from the transmitter (TR) to a second transmission/reception antenna (A2), a third signal path (SW3) from a receiver (RE) to the first transmission/reception antenna (A1) and a fourth signal path (SW4) from the receiver (RE) to the second transmission/reception antenna (A2). The switching elements (SE1 . . . SE4) form here, together with the signal paths (SW1 . . . SW4), a ring circuit.

3 Claims, 1 Drawing Sheet

ANTENNA SWITCH FOR WIRELESS ANTENNA DIVERSITY TELECOMMUNICATIONS DEVICES WITH TWO ANTENNAS

BACKGROUND OF THE INVENTION

The invention relates to an antenna switch for wireless antenna diversity telecommunications devices with two antennas.

Wireless antenna diversity telecommunications devices are for example, wireless TDMA (Time Division Multiple Access) telecommunications devices according to the DECT standard (Digital European Cordless Telecommunication; cf. Nachrichtentechnik Elektronik (Telecommunication Electronics), Berlin, year 42, No. 1, 1-2/1992, pages 23 to 29, U. Pilger: "Struktur des DECT-Standards") or according to the GSM Standard (Groupe Speciale Mobile or Global Systems for Mobile Communication; cf. Informatik Spektrum (Computing Publication), Springer Verlag Berlin, year 14, 1991, No. 3, pages 137 to 152, A. Mann: "Der GSM-Standard—Grundlage für digitale europäische Mobilfunknetze"). Wireless antenna diversity telecommunications devices with two antennas are known from International Application WO/94/10812 (FIGS. 1 and 2 with the associated description). The known antenna diversity radio transceiver has an antenna switch with two in-series switching elements (Diversity Switch DS and T/R Switch T/R-S according to FIG. 2 in International Application WO 94/10812) for switching over between the two antennas (implementation of "antenna diversity") and switching over between transmission and reception mode of the transceiver.

FIG. 1 shows the basic circuit diagram of such a cascade antenna switch 1, which has two in-series switching elements, a first switching element SE-I and a second switching element SE-II. These switching elements SE-I and SE-II switch through selectively a first signal path SW1 from a transmitter TR to a first transmission/reception antenna A1, a second signal path SW2 from the transmitter TR to a second transmission/reception antenna A2, a third signal path SW3 from a receiver RE to the first transmission/reception antenna A1 and a fourth signal path SW4 from the receiver RE to the second transmission/reception antenna A2. With this cascade configuration, switching losses occur at each switching element SE-I, SE-II for the implementation of the switching functions described above. These switching losses unnecessarily reduce the transmission power irradiated and the reception sensitivity of the transceiver.

SUMMARY OF THE INVENTION

It is an object of the present invention to minimize switching losses occurring with two antennas in antenna switches for wireless antenna diversity telecommunications devices.

In general terms the present invention is an antenna switch for wireless antenna diversity telecommunications devices having two transmission/reception antennas. In the antenna switch there are four signal paths that can be switched through selectively. A first signal path is from a transmitter to a first transmission/reception antenna, a second signal path is from the transmitter to a second transmission/reception antenna, a third signal path is from a receiver to the first transmission/reception antenna and a fourth signal path is from the receiver to the second transmission/reception antenna. An electronic switching element is arranged in each signal path. The switching elements are connected together to form a ring circuit. In alternative embodiments of the present invention the switching elements are PIN diodes or switching diodes.

This object is achieved on the basis of the antenna switch defined in the preamble of patent claim 1 by means of the features specified in the characterizing part of patent claim 1.

In the antenna switch of the present invention for wireless antenna diversity telecommunications devices with two transmission/reception antennas (for example a base station of a DECT cordless telephone), each of the switching functions assigned to the antenna switch utilize respectively only one single electronic switching element. The switching element can be, for example, as a PIN diode or switching diode arranged in a ring circuit. With the present invention switching losses which occur may be reduced by half in comparison with known antenna switches. Moreover, the antenna switch of the present invention may be integrated into a single housing, as a result of which in particular the equipping costs or manufacturing costs of the antenna switch are reduced.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

Figure 2:
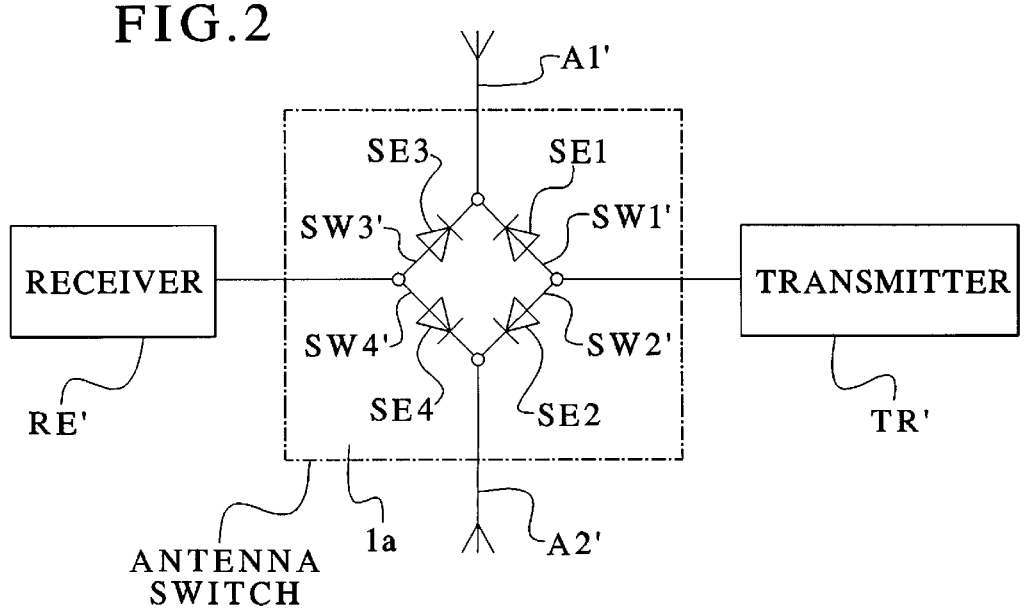

An exemplary embodiment of the present invention is depicted in FIG. 2.

DESCRIPTION OF THE PREFERRED EMBODIMENTS

Figure 1:
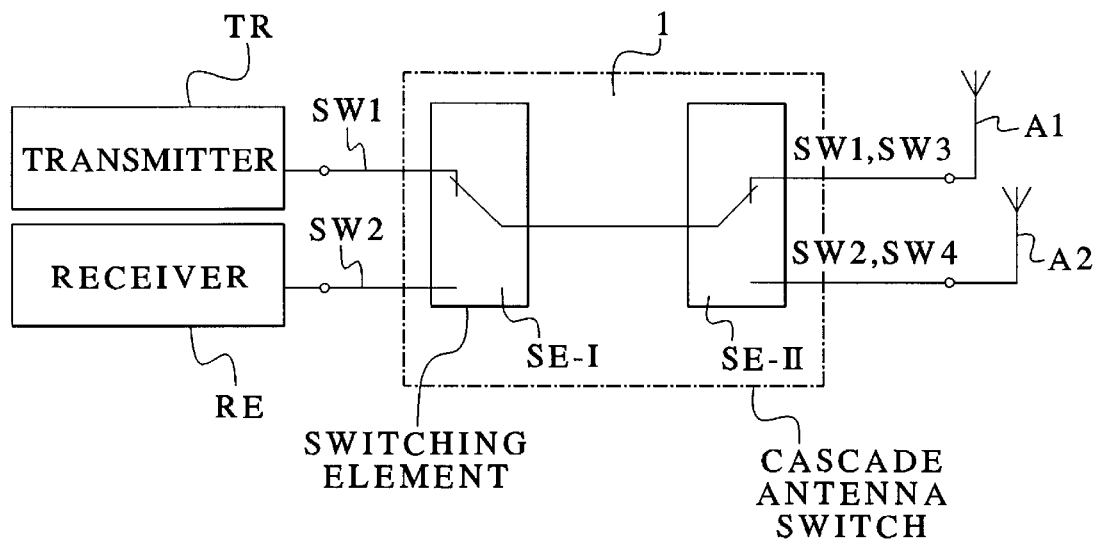
FIG. 1 depicts a prior art antenna switch.

FIG. 2 shows, on the basis of the antenna switch 1 depicted in to FIG. 1, a modified antenna switch 1a in which a single electronic switching element SE1 . . . SE4, which may be constructed for example as a PIN diode or as a switching diode, is provided for each signal path SW1' . . . SW4' that respectively correspond to the signal paths SW1 . . . SW4 in FIG. 1. The switching elements SE1 . . . SE4 form a ring circuit with the signal paths SW1 . . . SW4.

The antenna switch of the present invention has a first signal path SW1' from a transmitter TR' to a first transmission/reception antenna A1', a second signal path SW2' from the transmitter TR' to a second transmission/reception antenna A2', a third signal path SW3' from a receiver RE' to the first transmission/reception antenna A1' and a fourth signal path SW4' from the receiver RE' to the second transmission/reception antenna A2'. As shown in FIG. 2 the switching elements SE1 . . . SE4 are connected together to form a ring circuit.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An antenna switch for wireless antenna diversity telecommunications devices with two transmission/reception antennas, comprising:

antenna switch structured such that the antenna switch selectively switches through, a first signal path from a transmitter to a first transmission/reception antenna, a second signal path from the transmitter to a second transmission/reception antenna, a third signal path from a receiver to the first transmission/reception antenna and a fourth signal path from the receiver to the second transmission/reception antenna;

each of the first, second, third and fourth signal paths respectively having an electronic switching element, the switching elements connected together to form a ring circuit.

2. The antenna switch as claimed in claim 1, wherein the switching elements are PIN diodes.

3. The antenna switch as claimed in claim 1, wherein the switching elements are switching diodes.

* * * * *